(12) United States Patent
Kitajima et al.

(10) Patent No.: US 10,920,937 B2
(45) Date of Patent: Feb. 16, 2021

(54) LIGHT EMITTING DEVICE

(71) Applicant: NICHIA CORPORATION, Anan (JP)

(72) Inventors: Tadayuki Kitajima, Itano-gun (JP); Soichiro Miura, Tokushima (JP)

(73) Assignee: NICHIA CORPORATION, Anan (JP)

( * ) Notice: Subject to any disclaimer, the term of this patent is extended or adjusted under 35 U.S.C. 154(b) by 48 days.

(21) Appl. No.: 16/259,989

(22) Filed: Jan. 28, 2019

(65) Prior Publication Data

US 2019/0234565 A1    Aug. 1, 2019

(30) Foreign Application Priority Data

Jan. 30, 2018    (JP) .............................. JP2018-013695

(51) Int. Cl.
| | |
|---|---|
| *F21V 7/10* | (2006.01) |
| *F21K 9/64* | (2016.01) |
| *F21V 13/10* | (2006.01) |
| *F21V 11/16* | (2006.01) |
| *H01S 5/00* | (2006.01) |
| *H01S 5/022* | (2021.01) |

(Continued)

(52) U.S. Cl.
CPC .................. *F21K 9/64* (2016.08); *F21V 7/10* (2013.01); *F21V 11/16* (2013.01); *F21V 13/10* (2013.01); *H01S 5/005* (2013.01); *H01S 5/02292* (2013.01); *H01S 5/02296* (2013.01); *F21Y 2115/30* (2016.08); *H01S 5/02216* (2013.01); *H01S 5/4025* (2013.01)

(58) Field of Classification Search
CPC ..... F21K 9/64; F21K 9/23; F21K 9/68; H01S 5/005; H01S 5/02296; H01S 5/02292; H01S 5/02216; H01S 5/4025; F21V 7/10; F21V 13/10; F21V 11/16; F21Y 2115/30
See application file for complete search history.

(56) References Cited

U.S. PATENT DOCUMENTS

| | | | | |
|---|---|---|---|---|
| 6,495,861 | B1 * | 12/2002 | Ishinaga | ................... G09F 9/33 |
| | | | | 257/99 |
| 2006/0203860 | A1 | 9/2006 | Inoue et al. | |

(Continued)

FOREIGN PATENT DOCUMENTS

| | | |
|---|---|---|
| EP | 3 447 358 A1 | 2/2019 |
| JP | S53-126286 A | 11/1978 |

(Continued)

*Primary Examiner* — Rajarshi Chakraborty
*Assistant Examiner* — Fatima N Farokhrooz
(74) *Attorney, Agent, or Firm* — Foley & Lardner LLP

(57) ABSTRACT

A light emitting device includes: a base; a first semiconductor laser element disposed on an upper surface of the base and configured to emit first light; a first light reflecting member disposed on the upper surface of the base and configured to reflect the first light upwards; a phosphor member having a lower surface onto which the first light is irradiated and an upper surface serving as a light extraction surface; and a light shielding member surrounding lateral surfaces of the phosphor member. First and second regions of the first light reflecting member are formed such that a portion of the light reflected by the first region that is reflected on a side close to the second region and a portion of the light reflected by the second region that is reflected on a side close to the first region intersect before reaching the lower surface of the phosphor member.

15 Claims, 10 Drawing Sheets

(51) Int. Cl.
　　　*F21Y 115/30*　　　(2016.01)
　　　*H01S 5/02216*　　(2021.01)
　　　*H01S 5/40*　　　　(2006.01)

(56)　　　　　　References Cited

U.S. PATENT DOCUMENTS

| | | | |
|---|---|---|---|
| 2007/0273274 A1* | 11/2007 | Horiuchi | F21K 9/64 |
| | | | 313/504 |
| 2008/0112444 A1 | 5/2008 | Inoue et al. | |
| 2009/0003400 A1* | 1/2009 | Nagahama | H01L 33/483 |
| | | | 372/50.23 |
| 2011/0149601 A1* | 6/2011 | Jang | H01L 25/0753 |
| | | | 362/612 |
| 2012/0039072 A1 | 2/2012 | Lell et al. | |
| 2016/0084451 A1* | 3/2016 | Annen | F21V 13/14 |
| | | | 362/553 |
| 2016/0095184 A1* | 3/2016 | Nakabayashi | H01L 33/486 |
| | | | 313/503 |
| 2017/0122505 A1 | 5/2017 | Kiyota et al. | |
| 2018/0195684 A1* | 7/2018 | Vissenberg | F21K 9/233 |

FOREIGN PATENT DOCUMENTS

| | | |
|---|---|---|
| JP | 2006-134948 A | 5/2006 |
| JP | 2007-043060 A | 2/2007 |
| JP | 2011-114116 A | 6/2011 |
| JP | 2012-512508 A | 5/2012 |
| JP | 2015-173213 A | 10/2015 |
| JP | 2017-117880 A | 6/2017 |
| WO | WO-2018/021414 A1 | 2/2018 |

\* cited by examiner

LIGHT EMITTING DEVICE

CROSS-REFERENCE TO RELATED APPLICATION

This application claims priority to Japanese Patent Application No. 2018-013695, filed on Jan. 30, 2018, the disclosure of which is hereby incorporated by reference in its entirety.

BACKGROUND

The present disclosure relates to a light emitting device.

There is known a light emitting device that includes multiple semiconductor laser elements, a light reflecting member having multiple light reflecting surfaces, a phosphor member disposed above the light reflecting member, and a light shielding member disposed on the lateral sides of the phosphor member. See, for example, FIG. 27 of PCT Publication No. 2012-512508.

SUMMARY

There are cases where the intensity of the emitted light irradiated on the lower surface of the phosphor member is higher in the central portion of the light emitted from the laser element than the area surrounding the central portion. In this case, because a large amount of heat is generated in the region of the phosphor member irradiated by the central portion of the light emitted from the laser element, the conversion efficiency of the phosphor member will likely decline. Furthermore, emission intensity non-uniformity may occur in the light extracted from the phosphor member.

In one embodiment of the present disclosure, a light emitting device includes: a base; a first semiconductor laser element disposed on an upper surface of the base and emitting first light; a first light reflecting member disposed on the upper surface of the base and reflecting the first light upwards; a phosphor member having a lower surface onto which the first light is irradiated, and an upper surface serving as the light extraction surface; and a light shielding member disposed to surround lateral surfaces of the phosphor member. The first light reflecting member includes a first region onto which a portion of the first light is irradiated, and a second region positioned farther from the first semiconductor laser element than the first region, onto which another portion of the first light is irradiated. The first region and the second region are formed so that the portion of the light reflected by the first region that is reflected on a side close to the second region and the portion of the light reflected by the second region that is reflected on a side close to the first region intersect before reaching the lower surface of the phosphor member, to thereby irradiate both end portions in a longitudinal direction of the irradiated region in the lower surface of the phosphor member.

With the light emitting device described above, the conversion efficiency decline of the phosphor member can be attenuated while reducing non-uniformity in the emission intensity of the light extracted from the phosphor member.

EMBODIMENT

Figure 1:
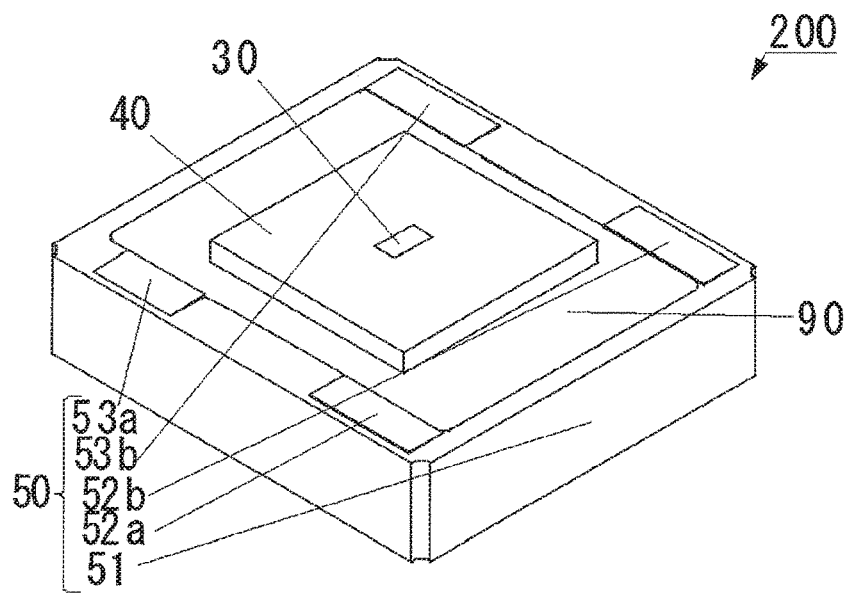
FIG. 1 is a perspective view of the light emitting device related to a first embodiment.

Certain embodiments of the present disclosure will be explained with reference to the accompanying drawings. However, the embodiments described below are for giving shape to the technical ideas of the present disclosure, and are not intended to limit the present invention. The sizes and positional relationships of the members shown in the drawings might be exaggerated for clarity of explanation. The light extraction side (i.e., the upper side in FIG. 3) of the light emitting device herein is referred to as above/upper/upwards, and the opposite side (i.e., the lower side in FIG. 3) will be referred to as below/lower/downwards.

First Embodiment

Figure 2:
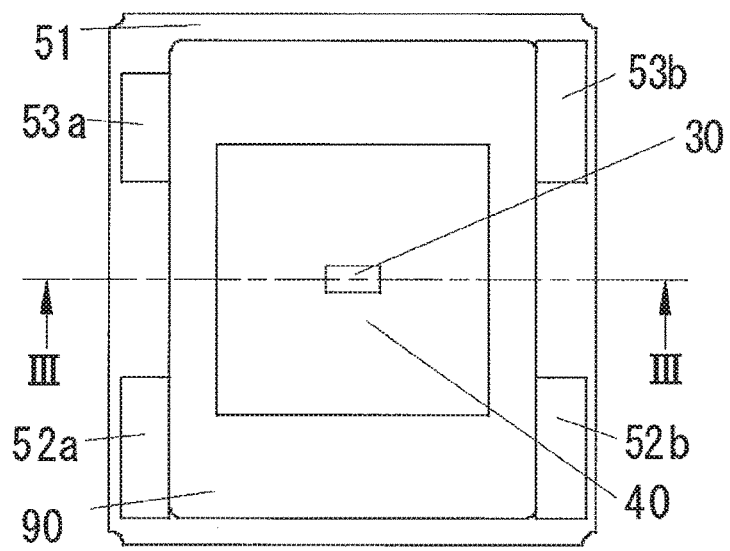
FIG. 2 is a top view of the light emitting device related to the first embodiment.
Figure 3:
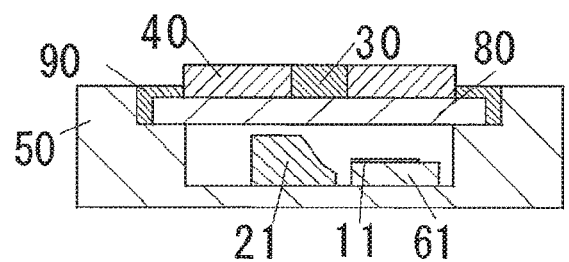
FIG. 3 is a cross-sectional view taken along line III-III in FIG. 2.
Figure 4:
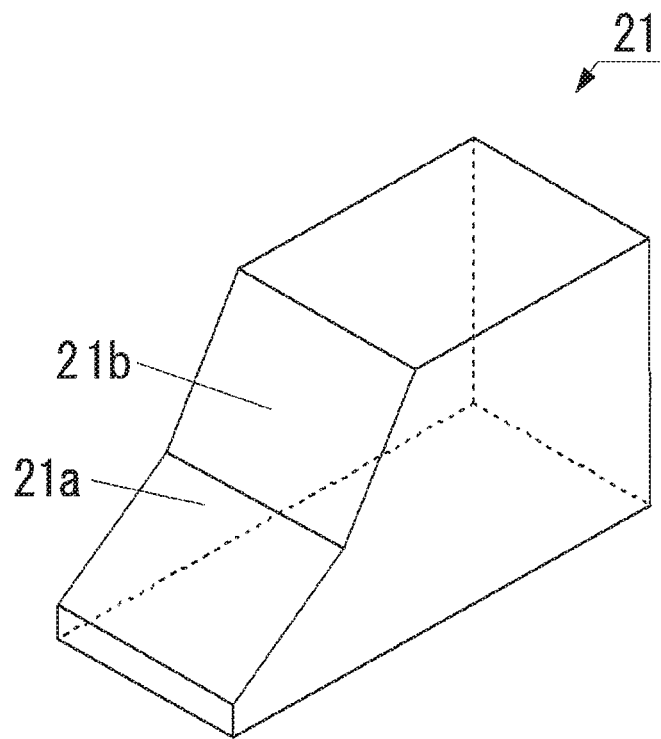
FIG. 4 is a perspective view of the first light reflecting member of the light emitting device related to the first embodiment.
Figure 5:
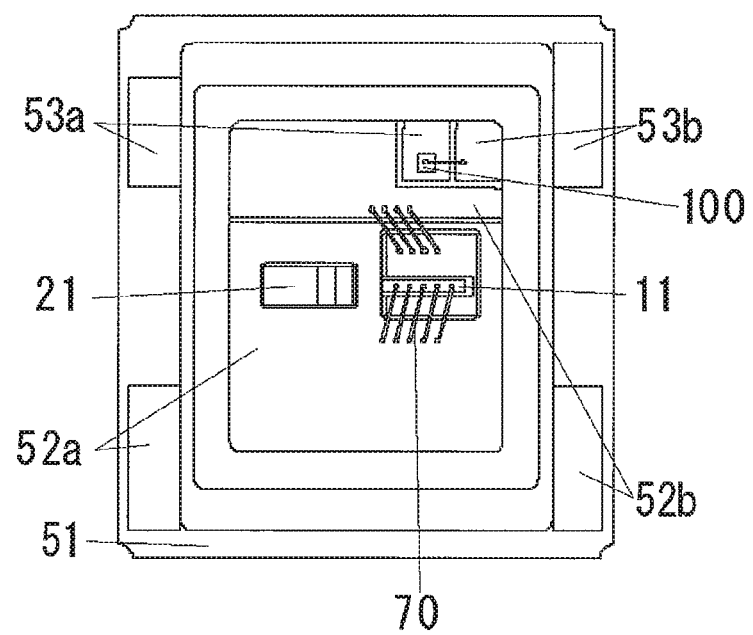
FIG. 5 is a schematic diagram illustrating the interior of the recess of the base in the light emitting device related to the first embodiment.
Figure 6:
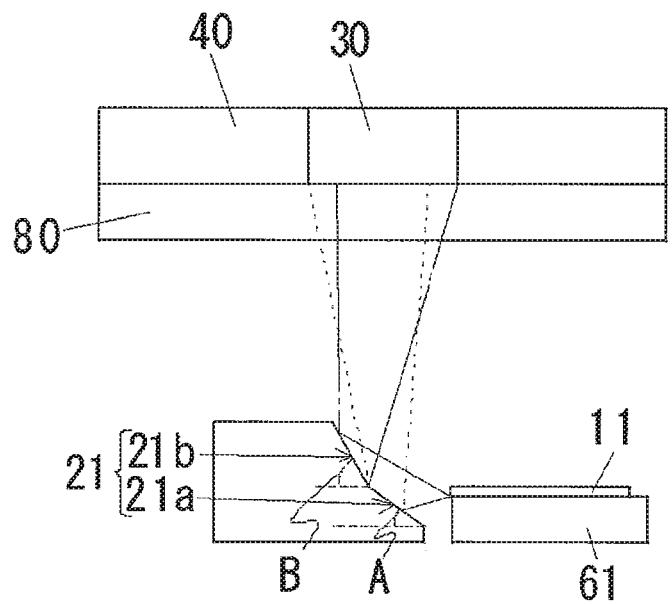
FIG. 6 is a schematic diagram explaining the paths of the first light from the first semiconductor laser element that irradiates the lower surface of the phosphor member after being reflected by the first light reflecting member in the light emitting device related to the first embodiment.

FIG. 1 is a perspective view of the light emitting device 200 related to a first embodiment. FIG. 2 is a top view of the light emitting device 200. FIG. 3 is a cross-sectional view taken along III-III in FIG. 2. FIG. 4 is a perspective view of the first light reflecting member 21 included in the light emitting device 200. FIG. 5 is a top view illustrating the interior of the recess of the base 50. FIG. 6 is a schematic diagram showing the paths of the first light from the first semiconductor laser element 11 (hereinafter the "semiconductor laser element" will also be referred to as "laser diode element" or "LD element") irradiated onto the lower surface of the phosphor member 30 after being reflected by the first light reflecting member 21.

As shown in FIG. 1 to FIG. 6, the light emitting device 200 includes a base 50, a first LD element 11 disposed on an upper surface of the base 50 and emitting first light, a first light reflecting member 21 disposed on the upper surface of the base 50 and reflecting the first light upwards, a phosphor member 30 having a lower surface onto which the first light is irradiated and an upper surface serving as the light extraction surface, and a light shielding member 40 disposed to surround the lateral surfaces of the phosphor member 30. The first light reflecting member 21 includes a first region 21a onto which a portion of the first light is irradiated, and a second region 21b, positioned farther from the first LD element 11 than the first region 21a, the second region onto which another portion of the first light is irradiated. The first region 21a and the second region 21b are formed so that the portion of the light reflected by the first region 21a that is reflected on a side close to the second region 21b and the portion of the light reflected by the second region 21b that is reflected on a side close to the first region 21a intersect before reaching the lower surface of the phosphor member 30, to thereby irradiate both end portions in a longitudinal direction of the irradiated region in the lower surface of the phosphor member 30.

The light emitting device 200 can achieve reduction in the emission intensity non-uniformity of the light extracted from the phosphor member 30, and attenuation of the conversion efficiency decline of the phosphor member 30. This will be explained in detail below.

In the case of a conventional light emitting device, the light from the first LD element has higher luminous intensity in the central portion than the portions distant from the central portion (near the outer edges) of the irradiated region in the lower surface of the phosphor member. In a conventional light emitting device, for example, the light emitted from the LD element is reflected by the light reflecting surface, which is slanted at 45 degrees from a line perpendicular to the top surface of the base, to irradiate the lower surface of the phosphor member. At this time, the lower surface of the phosphor member is irradiated while the luminous intensity distribution is being maintained. In this case, because the amount of heat generated in the high luminous intensity region of the phosphor member is larger than the amount of heat generated in the areas surrounding this region, the conversion efficiency of the phosphor member is reduced. The differences in intensity of the light irradiated onto the phosphor member likely causes non-uniformity in the intensity of light extracted from the phosphor member.

Accordingly, the light emitting device 200 is designed so that the luminous intensity of the first light in the center of the irradiated region is not excessively higher than the luminous intensity at the end portions of the irradiated region of the lower surface of the phosphor member 30 (i.e., the region onto which light from one or more LD elements is irradiated). Specifically, as shown in FIG. 6, the first light reflecting member 21 has a first region 21a and a second region 21b so that the high intensity portion of the light reflected by the first region 21a (i.e., the light reflected near the left end of the first region 21a shown in FIG. 6) and the high intensity portion of the light reflected by the second region 21b (i.e., the light reflected near the right end of the second region 21b shown in FIG. 6) intersect before being irradiated onto the lower surface of the phosphor member 30, to thereby irradiate the regions near the light shielding member 40 in the irradiated region. It is believed that because this can reduce the emission intensity at the center in the irradiated region of the phosphor member 30 so as not to be excessively high, a light emitting device with reduced emission intensity non-uniformity at the phosphor member 30 and attenuated conversion efficiency decline at the phosphor member 30 can be achieved. In the present specification, the first LD element 11 is disposed so that the "high luminous intensity region" of the light emitted from the first LD element 11 irradiates the interface between the first region 21a and the second region 21b. The "high luminous intensity region" in the present specification refers to the portion having at least 70% luminous intensity in the far field pattern (FFP) assuming that the lowest region is 0% and the highest region is 100%. The "FFP" in the present specification shows luminous intensity distribution of the first light measured at a plane that is located at a certain distance from and parallel to the emission surface of a LD element, and is identified as the shape at a given intensity, for example, $1/e^2$ of the peak intensity value.

The constituent elements of the light emitting device 200 will be explained below.

Base 50

The base 50 is a member on which a first LD element 11 is mounted. In the present embodiment, a base 50 having a recess is used, and the first LD element 11 is disposed on the upper surface of the base 50 in the recess (i.e., the first upper surface that forms the bottom of the recess).

The recess of the base 50 has a first upper surface, and a second upper surface that is located higher than the first upper surface and inside the recess. In other words, the recess has a second upper surface and a third upper surface upwardly stepwise from the first upper surface. The first upper surface, the second upper surface, and the third upper surface are substantially parallel to the lower surface of the base 50. A cover 80 formed of a material comprising a light transmissive material is placed on the second upper surface, and the phosphor member 30 and the light shielding member 40 are secured to the upper surface of the cover 80. For the base 50, one having no second upper surface may be used. In this case, the cover 80 is disposed on the surface corresponding to the third upper surface of the base 50.

As shown in FIG. 5, the base 50 with a recess has a main body 51 formed of an insulator, wiring parts 52a and 52b each exposed from the main body 51 and disposed on the third upper surface and the first upper surface of the base 50, second wiring parts 53a and 53b each exposed from the main body 51 and disposed on the third upper surface and the first upper surface of the base 50 and electrically connected to a thermistor 100, and a metalized part exposed from the main body 51 at the second upper surface. By exposing each of the wiring parts 52a and 52b and each of the second wiring parts 53a and 53b that will be externally electrically connected at the surfaces other than the lower surface of the main body 51, the entire lower surface of the base 50 can be used as the surface to be mounted on a heat dissipating member, such as a heat sink. This facilitates dissipation of the heat generated by the light emitting device to the heat dissipating member.

For the main body 51, a material comprising a ceramic as a main component may be used. Examples of ceramics include aluminum oxide, aluminum nitride, silicon nitride, or silicon carbide. Among such examples, a material comprising aluminum nitride as a main component is preferably used for the main body 51 from a heat dissipation perspective. For the wiring parts 52a and 52b and the second wiring parts 53a and 53b, metal materials, such as gold, silver, aluminum, palladium, or the like may be used. For the metalized part, metal materials such as gold may be used.

For the base 50, one having a base part and a frame part disposed on the upper surface of the base part may alternatively be used. In this case, the first LD element 11 is disposed on the upper surface of the base part inside the frame part. When using a base 50 having a base part and a frame part, the wiring parts 52a and 52b are preferably disposed on the upper surface of the base part on the outside of the frame part in consideration of the heat dissipation properties of the light emitting device.

First Semiconductor Laser Element 11

The first light emitted from the first LD element 11 has an oval-shaped FFP that has a larger length in the stacking direction of the multiple semiconductor layers including an active layer than the direction perpendicular thereto in a plane parallel to the emission surface of the first LD element 11. The first LD element 11 is disposed so that its emission surface is perpendicular to the lower surface of the base 50, and the longitudinal direction of the oval-shaped FFP is perpendicular to the lower surface of the base 50. This allows the first LD element 11 to be disposed so that its surface having a large surface parallels the lower surface of the base 50, thereby facilitating dissipation of the heat generated by the first LD element 11 through the base 50 and a heat sink. "Perpendicular" in the present specification may include the slant that can be caused during mounting process. For example, it includes a slant of about plus or minus 10 degrees.

For the first LD element 11, one having a peak emission wavelength in the range of from 320 nm to 530 nm, typically from 430 nm to 480 nm, can be used. The effect of attenuating the emission intensity non-uniformity can be notably demonstrated because an LD element having a peak emission wavelength within the stated range emits light of relatively high energy that likely causes the conversion efficiency reduction of the phosphor member 30. For the LD element having a peak emission wavelength within the range stated above, it is preferable to use materials that include a nitride semiconductor, such as one including at least one of GaN, InGaN, and AlGaN.

The first LD element 11 is mounted on the base 50 via a first submount 61. This can increase the distance from the emission point in the emission surface of the first LD element 11 to the mounting surface of the base 50 for mounting the first LD element (i.e., the first upper surface in the recess in FIG. 3) by the thickness of the first submount 61, thereby allowing the emitted light from the first LD element 11 to efficiently irradiate the first light reflecting member 21. The first LD element 11 can be secured to the first submount 61 using a conductive layer such as Au—Sn.

For the first submount 61, it is preferable to use a material having a thermal expansion coefficient between the thermal expansion coefficient of the base 50 and the thermal expansion coefficient of the first LD element 11. This can reduce the delamination of the first LD element 11 and/or the first submount 61. In the case of using materials comprising a nitride semiconductor as the first LD element 11, aluminum nitride or silicon carbide, for example, can be used for the first submount 61.

The first LD element 11 is electrically connected to the wiring parts 52a and 52b of the base 50 using wires 70 (fine metal wires).

In the present embodiment, one LD element is disposed on the base, but multiple LD elements may be disposed. In the case of disposing multiple LD elements, the light emitting device is designed so that the intensity of light in the central portion will not be excessively higher than the intensity of light in the end portions of the overall light irradiated onto the irradiated region of the lower surface of the phosphor member.

First Light Reflecting Member 21

The first light reflecting member 21 reflects the first light emitted from the first LD element 11 towards the phosphor member 30. By allowing the first light reflecting member 21 to reflect the first light from the first LD element 11 as in the case of the light emitting device 200, the luminous intensity at the central portion of the first light irradiated onto the irradiated region of the phosphor member 30 can be kept at a level that is not excessively higher while reducing the thickness of the light emitting device 200 (i.e., length in the up and down direction in FIG. 3) as compared to the case in which improvement of uniformity in the emission intensity of the first light is achieved by using a transmissive lens.

Examples of material for the first light reflecting member 21 include a material comprising a heat resistant material as the main material, including quartz, glass such as BK7, metal such as aluminum, or the like. Examples of material for a light reflecting surface of the first light reflecting member 21 include a highly reflective material, such as a metal, dielectric multilayer film, or the like.

The first light reflecting member 21, as shown in FIG. 6, includes a first region 21a that is irradiated with a portion of the first light, and a second region 21b that is positioned farther from the first LD element 11 than the first region 21a and irradiated with another portion of the first light. The first region 21a and the second region 21b are formed so that the portion of the light reflected by the first region 21a that is reflected on the side close to the second region 21b and the portion of the light reflected by the second region 21b that is reflected on the side close to the first region 21a intersect before reaching the lower surface of the phosphor member 30, to thereby irradiate both end portions in the longitudinal direction of the irradiated region in the lower surface of the phosphor member 30.

Figure 7:
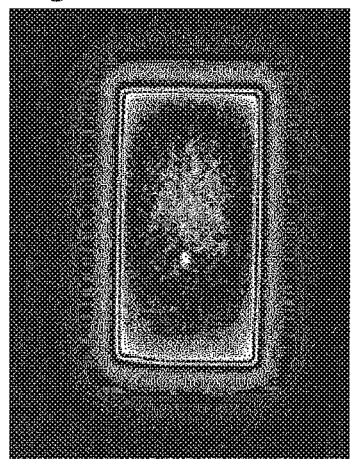
FIG. 7 shows the emission intensity distribution data measured at the phosphor member when irradiating the phosphor member with light having a relatively uniform luminous intensity.

The first region 21a and the second region 21b are preferably provided so that the luminous intensity in the regions near the light shielding member 40 is higher than the luminous intensity in the center of the irradiated region in the lower surface of the phosphor member 30. In other words, in the irradiated region in the lower surface of the phosphor member 30, the luminous intensity at both end portions in the longitudinal direction is preferably higher than the luminous intensity in the central portion. FIG. 7 is a photograph showing the luminous intensity distribution measured from the upper surface side of the phosphor member while irradiating the irradiated region with the first light having nearly uniform luminous intensity. As is understood from FIG. 7, even when the first light having nearly uniform luminous intensity is applied to the irradiated region in the phosphor member, the intensity of the light extracted from the areas near the light shielding member (i.e., along the peripheral edges of the phosphor member) was lower than the intensity of light extracted from the area farther from the light shielding member (i.e., the central portion of the phosphor member). This is believed to be caused by the light reflected by the light shielding member concentrating in the central portion. In contrast, it is believed that increasing the luminous intensity of the light in the regions near the light shielding member 40 can make nearly uniform intensity of light extracted from the phosphor member 30. For example, as shown in FIG. 6, by allowing the relatively high luminous intensity portion of the light reflected by the first region 21a to intersect with the relatively high luminous intensity portion of the light reflected by the second region 21b in their paths so as not to overlap on the lower surface of the phosphor member 30, the luminous intensity in both end portions in the longitudinal direction of the irradiated region of the phosphor member 30 in the longitudinal direction can be made higher than the luminous intensity in the central portion. The first region 21a and the second region 21b may alternatively be formed so that irradiation of light having uniform luminous intensity results in the irradiated region in the lower surface of the phosphor member 30. Even in this case, the effect can be achieved to some extent as compared to a conventional light emitting device in which the luminous intensity is high in the central portion.

In the light emitting device 200, the first region 21a and the second region 21b are provided to change the luminous intensity distribution only in the longitudinal direction of the oval shape resulting from irradiating the first light reflecting member 21. In other words, the first region 21a and the second region 21b are disposed so that the luminous intensity distribution at the central portion in the longitudinal direction would not become excessively high without changing the luminous intensity distribution along the short-side direction (i.e., perpendicular thereto). A larger effect can be achieved by controlling the luminous intensity distribution in the longitudinal direction because the FFP of the first LD element 11 tends to spread in the longitudinal direction. The luminous intensity distribution in the short-side direction can be changed, but it is preferable to dispose the first region 21a and the second region 21b so as to change the luminous intensity distribution only in the longitudinal direction in the oval shape of the first light, in consideration of the production accuracy of the first region 21a and the second region 21b of the first light reflecting member 21 as well as the positioning accuracy between the first light reflecting member 21 and the first LD element 11.

The first region 21a and the second region 21b are planar. That is, a light reflecting area of the first light reflecting member 21 are structured with two planar light reflecting surfaces. This not only makes it easier to design the first light reflecting member 21, but also provides a leeway in the tolerable range for positional displacement when mounting. Furthermore, the first light reflecting member 21 can be more easily formed because the first region 21a and the second region 21b are planar. In the present embodiment, the light reflecting area are configured with two planar surfaces, but may be configured with three or more planar surfaces. In the case of achieving a higher luminous intensity in both end portions in the longitudinal direction than the central portion of the irradiated region of the phosphor member 30, an even number of planes structure the light reflecting area. Moreover, the first region 21a and the second region 21b may be curved surfaces.

The angle A formed by a plane parallel to the surface on which the first light reflecting member 21 is mounted (i.e., the first upper surface of the base 50 in the case of the light emitting device 200) and the first region 21a is smaller than the angle B formed by a plane parallel to the surface on which the first light reflecting member 21 is mounted and the second region 21b. The angle A and the angle B are respectively inclined angles of the first region 21a and the second region 21b with respect to the plane parallel to the surface on with the first light reflecting member 21 is mounted. For example, the angle formed by the upper surface of the base 50 and the first region 21a of the first light reflecting member 21 is larger than 15 degrees, but smaller than 45 degrees, and the angle formed by the upper surface of the base 50 and the second region 21b of the first light reflecting member 21 is larger than 45 degrees, but smaller than 75 degrees.

Cover 80

The cover 80 when combined with the base 50 creates an airtight space in which the first LD element 11 is disposed. This can reduce the amount of organic substances and dust collected on the emission surface of the LD element. In the present embodiment, the cover 80 made of sapphire is used. A metallized film is formed in the region of the cover 80 to be secured to the base 50, and is secured to a part of the second upper surface that is also a metallized film by using an Au—Sn solder or the like. Because sapphire is a material that can relatively easily transmit the first light and has high thermal conductivity, it can dissipate the heat generated at the phosphor member 30 through the base 50. Securing the part using an Au—Sn solder or the like can reduce the distance from the first light reflecting member 21 to the lower surface of the phosphor member 30 as compared to seam welding or resistance welding, thereby increasing the luminance. For the cover 80, one made of a light transmissive material, including quartz, silicon carbide, or glass may alternatively be used.

Phosphor Member 30

The phosphor member 30 has a lower surface onto which the first light reflected by the first light reflecting member 21 is irradiated, and an upper surface that serves as the light extraction surface. As shown in FIG. 3, the phosphor member 30 is secured above the cover 80.

The phosphor member 30 contains a phosphor that emits fluorescent light when irradiated with the first light. Examples of phosphors include YAG phosphors, LAG phosphors, α-SiAlON phosphors, and the like. Among all, it is preferable to use a YAG phosphor that is highly heat resistant. The phosphor member 30 is made of an inorganic material. This can improve reliability because the part is more resistant to heat and light as compared to one containing an organic material. For the phosphor member 30 made of an inorganic material, a phosphor ceramic or a phosphor single crystal can be used. An example of a phosphor ceramic includes a sintered body that contains phosphor particles and additives functioning as a binder. In the case of using a YAG phosphor ceramic, aluminum oxide can be used as an additive. A phosphor member containing an organic material may be used as long as it is resistant to the first light.

As shown in FIG. 1 and FIG. 2, the upper surface of the phosphor member 30 has a shape that is elongated in one direction, and the lower surface of the phosphor member 30 also has a shape that is elongated in one direction. The irradiated region in the lower surface of the phosphor member 30 has a shape that is elongated in one direction. The first LD element 11 and the first light reflecting member 21 are disposed so that the longer sides of the lower surface of the phosphor member 30 is parallel to the longer sides of the irradiated region on the lower surface of the phosphor member 30. This shortens the distances from the irradiated region to the outer edges of the phosphor member 30 in the lower surface of the phosphor member 30, thereby facilitating dissipation of the heat generated at the phosphor member 30 through the light shielding member 40. This can facilitate attenuation of a conversion efficiency decline in the phosphor member 30. From the perspective of mass production of the phosphor member 30, the shapes of the upper surface and the lower surface of the phosphor member 30 shown in FIG. 1 and FIG. 2 are rectangular, but they may be oval.

In the present embodiment, in a plane parallel to the upper surface of the base 50, the distance from the emission point of the first LD element 11 to the light reflecting area of the first light reflecting member 21 is 0.48 mm. In a plane perpendicular to the upper surface of the base, the distance from the light reflecting point in the first light reflecting member 21 to the lower surface of the phosphor member 30 is 1.3 mm. Moreover, angle A is 33.5 degrees and angle B is 56.5 degrees. At this time, in a plane perpendicular to the upper surfaces of the base 50, the first region 21a, and the second region 21b, the length of the first region 21a (i.e., the length of the lower oblique surface in the first light reflecting member 21 in FIG. 6) is 0.36 mm, and the length of the second region 21b (i.e., the length of the upper oblique surface in the first light reflecting member 21 in FIG. 6) is 0.6 mm. The lower surface of the phosphor member is 1 mm in the long-side direction and 0.5 mm in the short-side direction.

Light Shielding Member 40

The light shielding member 40 is disposed to surround the lateral surfaces of the phosphor member 30. In other words, when viewed from above the phosphor member 30, the light shielding member 40 is disposed to surround the phosphor member 30. Provision of the light shielding member 40 can reduce light that is released from elsewhere than the upper surface of the phosphor member 30. The light shielding member 40 is disposed in direct contact with the phosphor member 30. This can facilitate dissipation of the heat generated at the phosphor member 30 as compared to being bonded by using a material having a relatively low thermal conductivity, such as a resin or glass.

In the case in which the phosphor member 30 contains a YAG phosphor, preferable material for the light shielding member 40 is a ceramic material containing aluminum oxide as a main component. The phosphor member 30 and the light shielding member 40 are directly bonded together by sintering. At this time, voids are present in the regions of the light shielding member 40 in the vicinity of the phosphor member 30. The light from the phosphor member 30 is less likely to transmit through the light shielding member 40 because it is reflected at the interfaces between the aluminum oxide particles and the voids. Being integrally sintered with the phosphor member and the presence of voids in the vicinity of the phosphor member 30 allow the light shielding member 40 to shield the light from the phosphor member 30 while increasing the adhesion between the phosphor member 30 and the light shielding member 40. The light shielding member 40 preferably has more voids in the regions in the vicinity of the phosphor member 30 than the regions near the peripheral edges of the light shielding member 40. In other words, the sintered density in the regions near the phosphor member 30 is preferably lower than the sintered density in the regions near the peripheral edges of the light shielding member 40. This can attenuate the mechanical strength decline of the light shielding member 40 while attenuating the decline in the reflectance of light from the phosphor member 30. For the light shielding member 40, aluminum nitride or the like may alternatively be used instead of aluminum oxide.

Second Light Shielding Member 90

In the case in which the cover is formed of a material comprising a light transmissive material, as shown in FIG. 3, it is preferable to provide a second light shielding member 90 to cover a portion of the upper surface of the cover 80 and the lateral surfaces of the cover 80. This can attenuate the leakage of the first light and the fluorescent light from the lateral surfaces of the cover 80 or the heat dissipater 110 described later. Examples of the materials employed for the second light shielding member 90 include a resin containing light scattering particles such as titanium oxide or the like.

Thermistor 100

As shown in FIG. 5, the light emitting device 200 includes a thermistor 100. Because the thermistor 100 enables measurement of the LD element temperature, the electric current supplied to the LD element can be varied in response to temperature change. For example, a ceramic material can be used for the thermistor 100. The thermistor 100 is disposed on the upper surface of the base 50 using a solder material, such as Au—Sn. The thermistor 100 is electrically connected to the second wiring part 53b via a wire.

Second Embodiment

Figure 8:
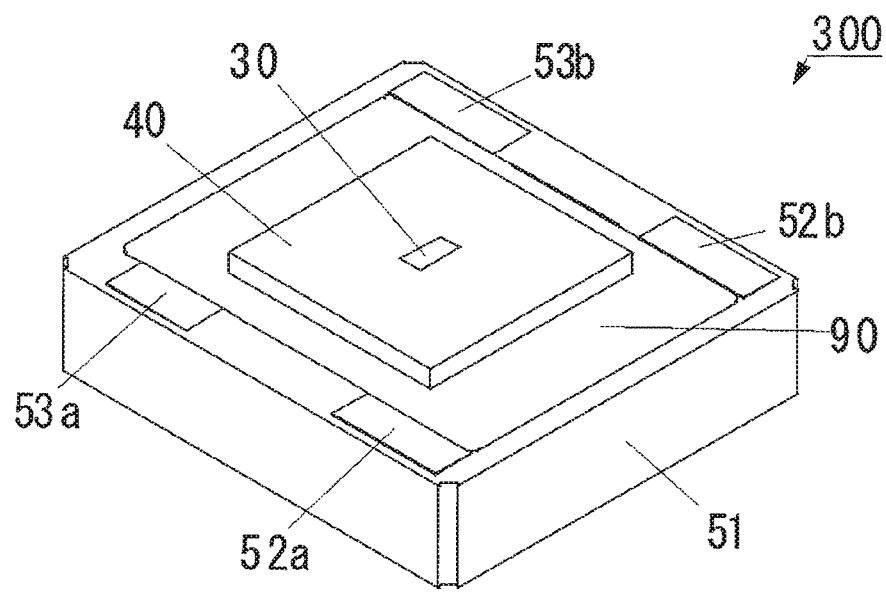
FIG. 8 is a perspective view of the light emitting device related to a second embodiment.
Figure 9:
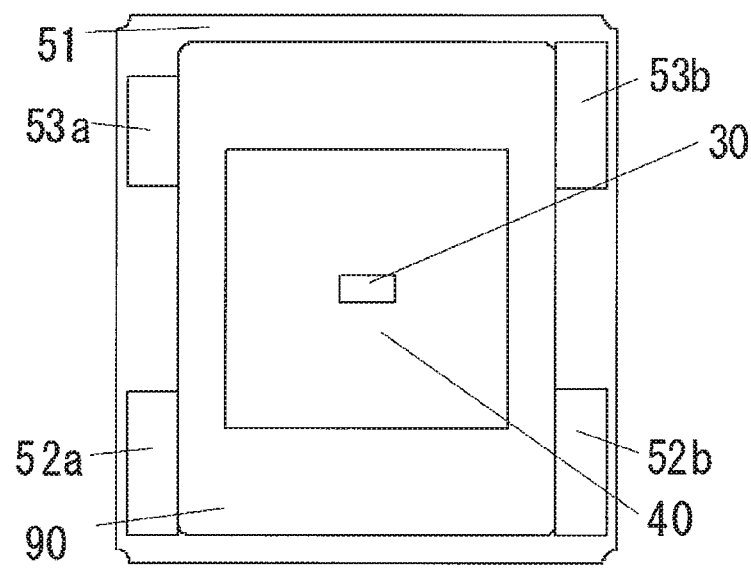
FIG. 9 is a top view of the light emitting device related to the second embodiment.
Figure 10:
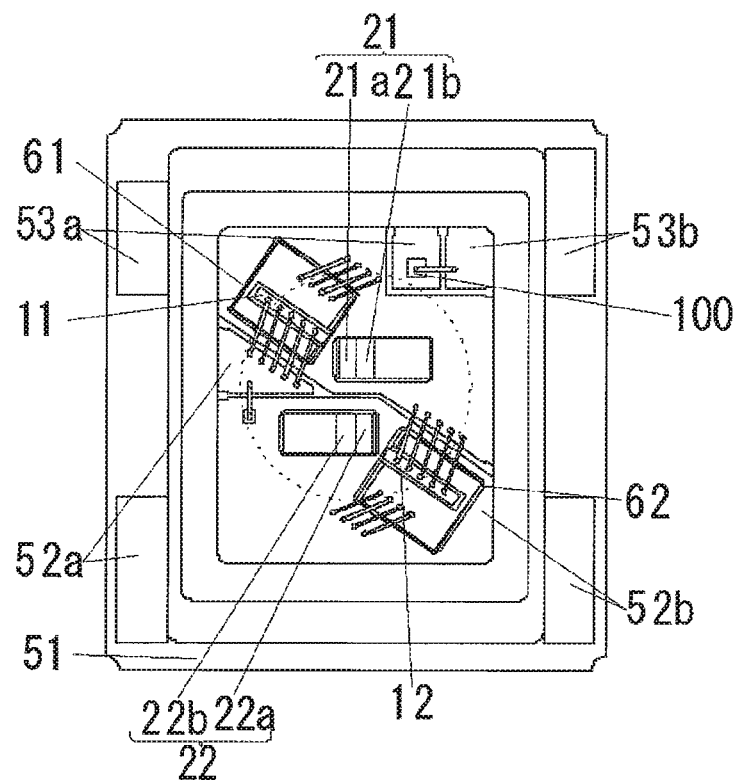
FIG. 10 is a schematic diagram illustrating the interior of the recess of the base in the light emitting device related to the second embodiment.
Figure 11:
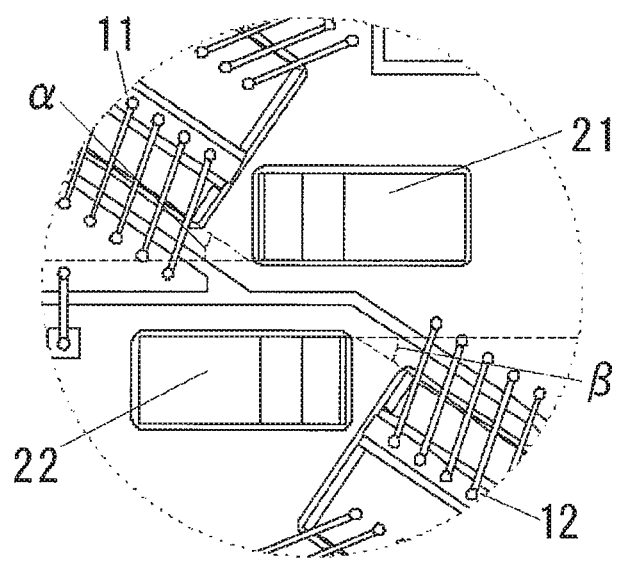
FIG. 11 is an enlarged view of the section encircled by the dotted line in FIG. 10.

FIG. 8 is a perspective view of the light emitting device 300 related to a second embodiment. FIG. 9 is a top view of the device in FIG. 8. FIG. 10 is a top view for illustrating the interior of the recess in the light emitting device 300, and FIG. 11 is an enlarged view of the section encircled by a dotted line in FIG. 10. The light emitting device 300 is essentially identical to the light emitting device 200 except for the features described below.

The light emitting device 300 includes a second LD element 12 disposed on the upper surface of the base 50 (i.e., the first upper surface of the base 50 in this embodiment) and emitting second light, and a second light reflecting member 22 disposed on the upper surface of the base 50 and reflecting the second light towards the lower surface of the phosphor member 30. This can increase the intensity of the light extracted from the phosphor member 30. The second light reflecting member 22 includes a third region 22a onto which a portion of the second light is irradiated and a fourth region 22b disposed farther from the second LD element 12 than the third region 22a onto which another portion of the second light is irradiated. The third region 22a and the fourth region 22b are formed so that the portion of the light reflected by the third region 22a that is reflected on the side close to the fourth region 22b and the portion of the light reflected by the fourth region 22b that is reflected on the side close to the third region 22a intersect before reaching the lower surface of the phosphor member 30, to thereby irradiate both end portions in the longitudinal direction of the irradiated region. The second light reflecting member 22 can be structured in the same or a similar manner to the first light reflecting member 21.

The second LD element 12 is secured to the upper surface of a second submount 62 via a conductive layer, in the same or a similar manner to the first LD element 11. The second LD element 12 and the second submount 62 can be structured in the same or a similar manner to the first LD element 11 and the first submount 61, respectively.

As shown in FIG. 10 and FIG. 11, a plane perpendicular to the emission surface of the first LD element 11 and the upper surface of the base 50 (i.e., the first upper surface of the base in this embodiment) is not parallel to a plane perpendicular to the upper surface of the base 50 and the first region 21a and the second region 21b of the first light reflecting member 21. Moreover, a plane perpendicular to the emission surface of the second LD element 12 and the upper surface of the base 50 is not parallel to a plane perpendicular to the upper surface of the base 50 and the third region 22a and the fourth region 22b of the second light reflecting member 22. In other words, in a top view, the first LD element 11 and the first light reflecting member 21 are diagonally disposed, and the second LD element 12 and the second light reflecting member 22 are similarly disposed diagonally. In this manner, the light from each LD element can be reflected in a direction other than the direction perpendicular to the upper surface of the base 50 (i.e., in the direction extending from the upper surface of the base 50 to the phosphor member 30) without complicating the light reflecting surface structure in each light reflecting member. This allows the light from two LD elements to irradiate a single phosphor member 30. To explain using FIG. 10, the light from the first LD element 11 irradiates the first light reflecting member 21 from the left side and reflected forward and downward seen as the plane figure and its orientation to irradiate the lower surface of the phosphor member 30, and the light from the second LD element 12 irradiates the second light reflecting member 22 from the right side and reflected forward and upward seen as the plane figure and its orientation to irradiate the lower surface of the phosphor member 30.

As shown in FIG. 11, a plane perpendicular to the emission surface of the first LD element 11 and the upper surface of the base 50 is referred to a first plane. A plane perpendicular to the upper surface of the base 50 and the first region 21a and the second region 21b of the first light reflecting member 21 is referred to a second plane. The angle defined by the first plane and the second plane is referred to as angle α, and is preferably in the range of from 10 to 60 degrees. A plane perpendicular to the emission surface of the second LD element 12 and the upper surface of the base 50 is referred to a third plane. A plane perpendicular to the upper surface of the base 50 and the third region 22a and the fourth region 22b of the second light reflecting member 22 is referred to a fourth plane. The angle defined by the third plane and the fourth plane is referred to as angle β, and is preferably in the range of from 10 to 60 degrees. Setting angle α and angle β to be 60 degrees at most can make the light reflected by each of the light reflecting members less spreading too much. More effectively, angle α and angle β are set in the range of from 30 to 40 degrees.

The angle formed by the surface on which the second light reflecting member 22 is disposed (i.e., the upper surface of the base 50 in this embodiment) and the third region 22a of the second light reflecting member 22 is larger than 15 degrees, but smaller than 45 degrees. The angle formed by the upper surface of the base 50 and the fourth region 22b of the second light reflecting member 22 is larger than 45 degrees, but smaller than 75 degrees. This can inhibit the intensity at the center of the irradiated region in the lower surface of the phosphor member 30 from being excessively higher than the intensity near the outer edges.

As shown in FIG. 10 and FIG. 11, the first LD element 11 and the second LD element 12 are disposed so that the emission surface of the first LD element 11 is diagonally opposite from the emission surface of the second LD element 12. In this manner, as shown in FIG. 8 and FIG. 9, the phosphor member 30 can be disposed in the central portion of the light emitting device 300, thereby facilitating relatively uniform dissipation of the heat generated at the phosphor member 30.

Figure 12:
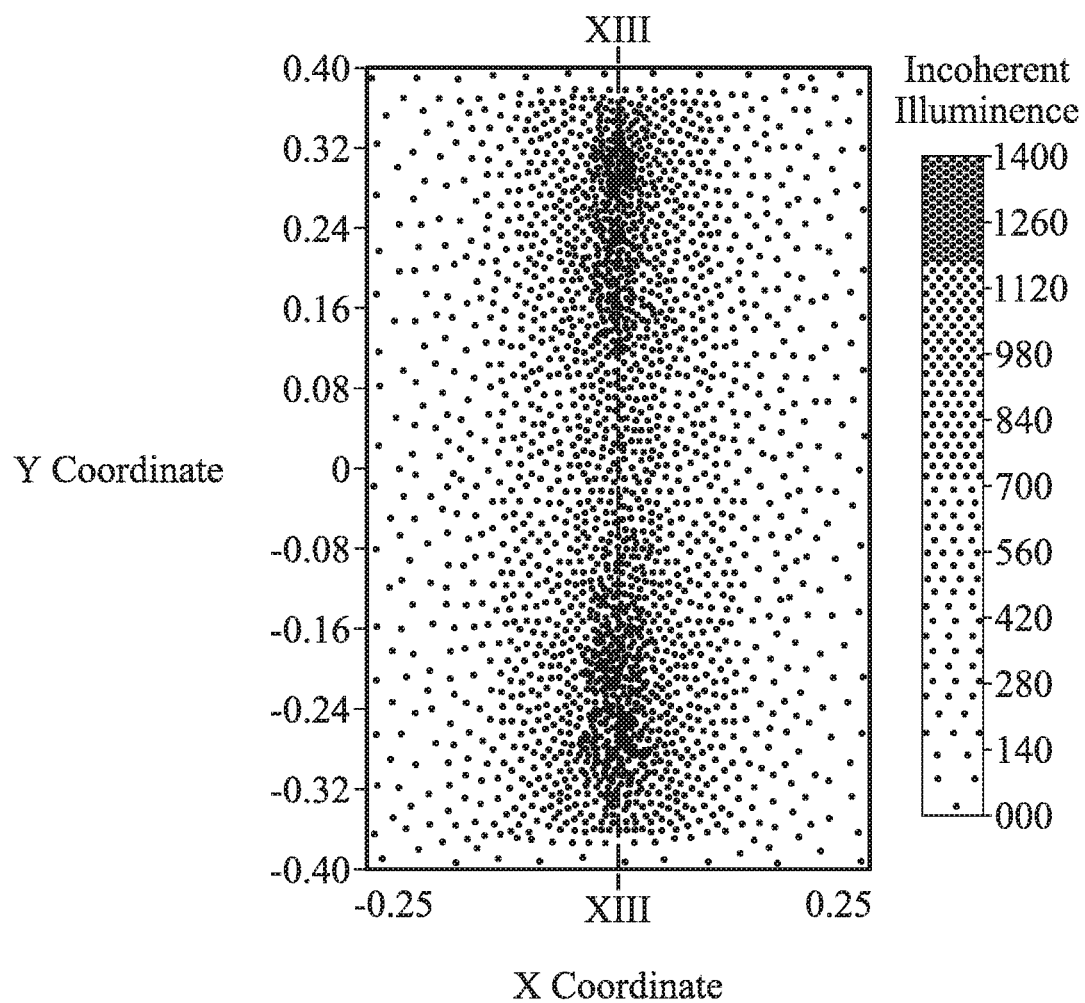
FIG. 12 shows the simulation data of the luminous intensity distribution of the first light and the second light irradiated onto the lower surface of the phosphor member.
Figure 13:
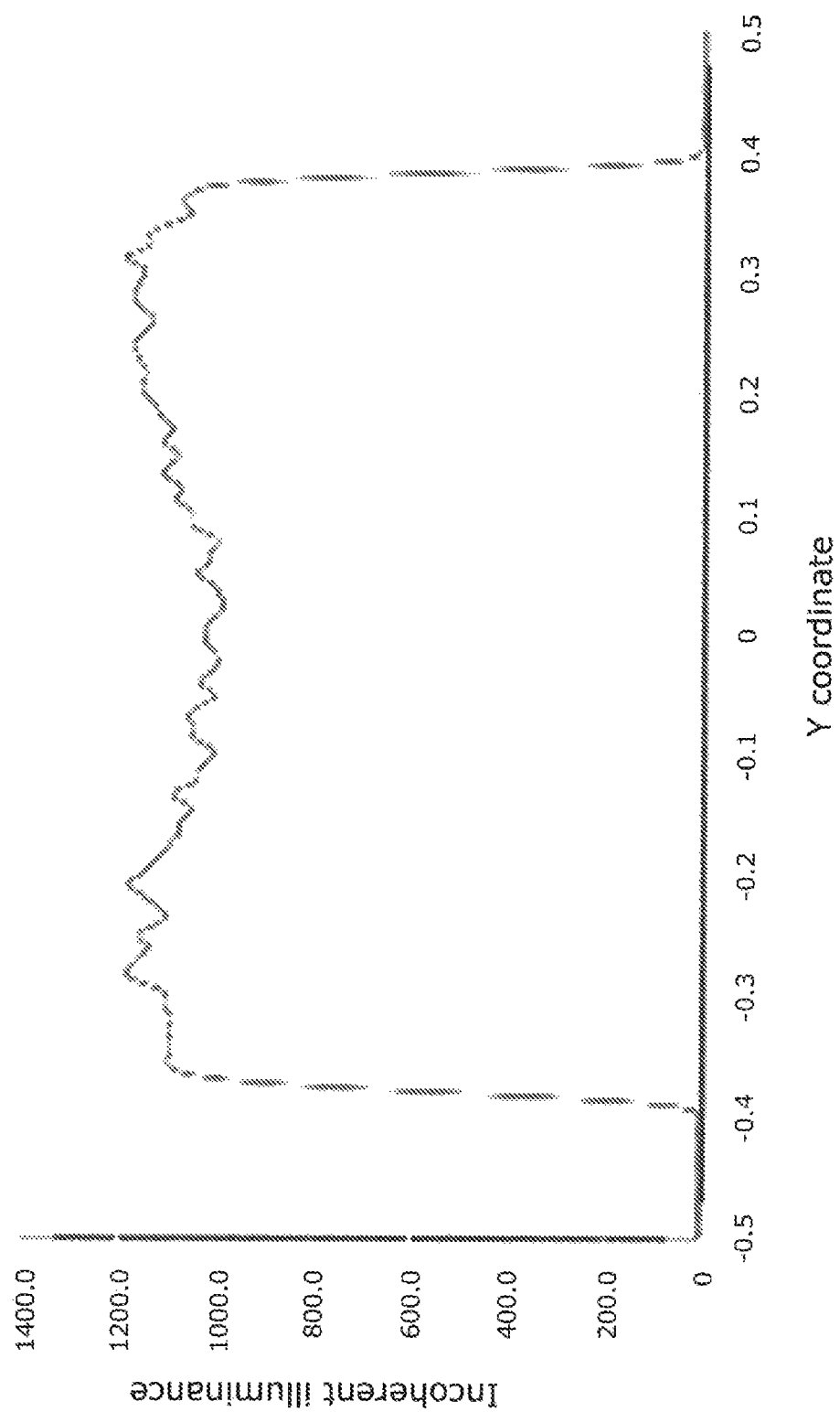
FIG. 13 shows the luminous intensity distribution along the straight line XIII-XIII in FIG. 12.
Figure 14:
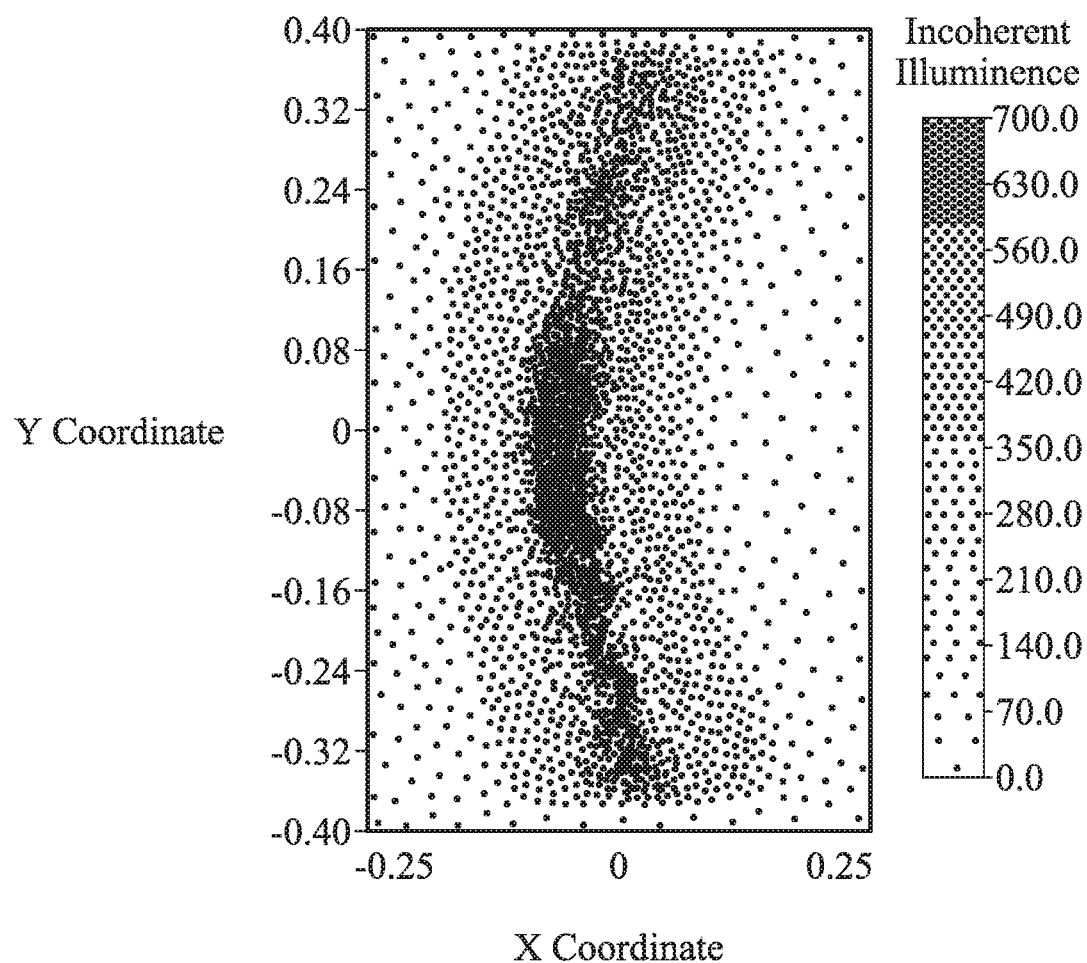
FIG. 14 shows the simulation data of the luminous intensity distribution of the first light irradiated onto the lower surface of the phosphor member.

FIG. 12 shows a simulated luminous intensity distribution of the first light and the second light irradiated onto the lower surface of the phosphor member 30 in the light emitting device 300, and FIG. 13 is a graph showing the luminous intensity distribution along line XIII-XIII in FIG. 12. FIG. 14 shows a simulated luminous intensity distribution of the first light irradiated onto the lower surface of the phosphor member 30. The simulation conditions will be explained below with reference to FIG. 10 and FIG. 11.

The first LD element 11, the first light reflecting member 21, and the phosphor member 30 are structured in the same or a similar manner to in the first embodiment. The distance from the emission point of the second LD element 12 to the light reflecting area of the second light reflecting member 22 is 0.64 mm on a plane parallel to the upper surface of the base 50. The angle formed by the upper surface of the base 50 and the third region 22a of the second light reflecting member 22 is 33.5 degrees, the angle formed by the upper surface of the base 50 and the fourth region 22b of the second light reflecting member 22 is 56.5 degrees. Angle α and angle β are each 34 degrees. At this time, the lengths of the third region 22a and the fourth region 22b in a plane perpendicular to the upper surface of the base 50 in a direction extending from the base 50 to the phosphor member 30, the third region 22a, and the fourth region 22b are 0.36 mm and 0.6 mm, respectively.

As shown in FIG. 14, the intensity distribution of the light from the first LD element 11 is curved in the center of the phosphor member 30. The intensity distribution of the light from the second LD element 12 is curved so as to have line symmetry about an axis that is the lengthwise center line of the phosphor member 30 (i.e., the vertical direction in FIG. 14). In other words, the light emitting device 300 has a structure in which the lights from two semiconductor laser elements do not readily overlap in the center while partially overlapping at both end portions in the longitudinal direction of the irradiated region. It is believed that because this can make the luminous intensity at both end portions of the irradiated region slightly higher than the luminous intensity in the center, light having more uniform emission intensity can be obtained from the phosphor member 30. In this embodiment, the first light reflecting member 21 and the second light reflecting member 22 both have multiple light reflecting surfaces, while the first LD element 11 and the first light reflecting member 21, and the second LD element 12 and the second light reflecting member 22, are diagonally arranged, to thereby allow the first light and the second light to be bent to irradiate the lower surface of the phosphor member 30. In the present embodiment, the luminous intensity at both end portions in the longitudinal direction of the irradiated region is made higher, but the first LD element 11, the first light reflecting member 21, the second LD element 12, and the second light reflecting member 22 may be positioned so that the luminous intensity are nearly equal between the central portion and the end portions.

Third Embodiment

Figure 15:
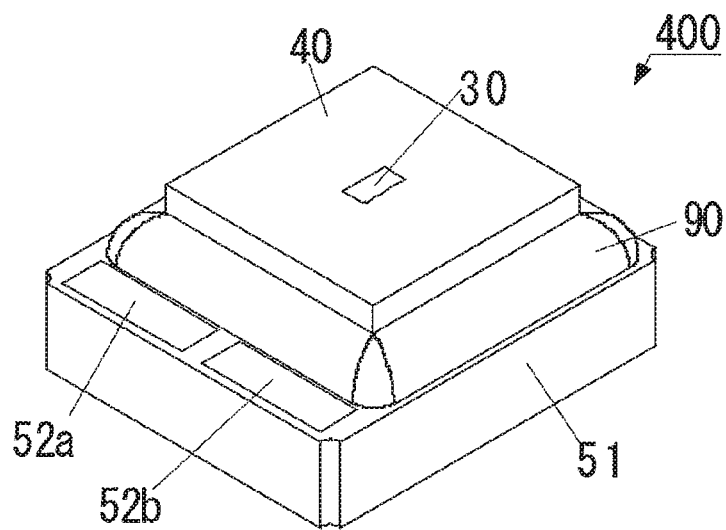
FIG. 15 is a perspective view of the light emitting device related to a third embodiment.
Figure 16:
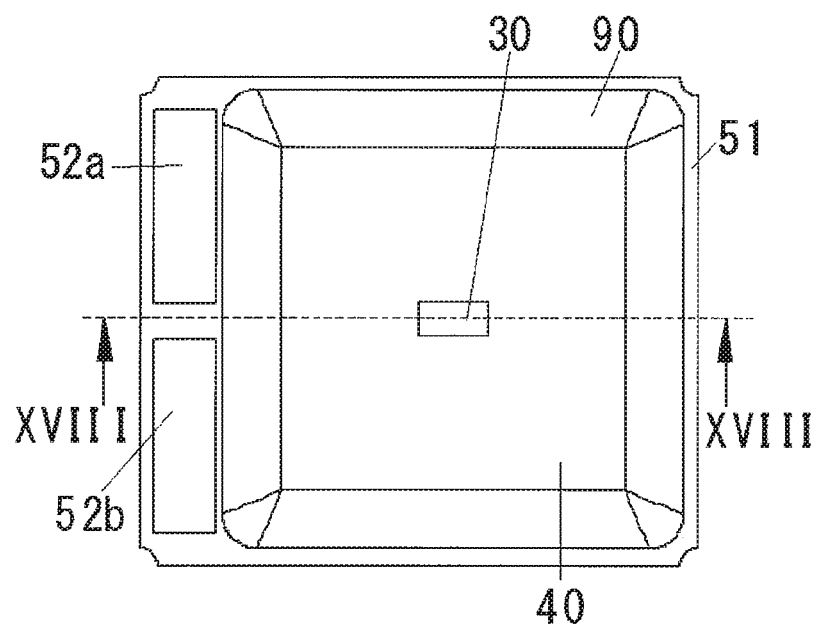
FIG. 16 is a top view of the light emitting device related to the third embodiment.
Figure 17:
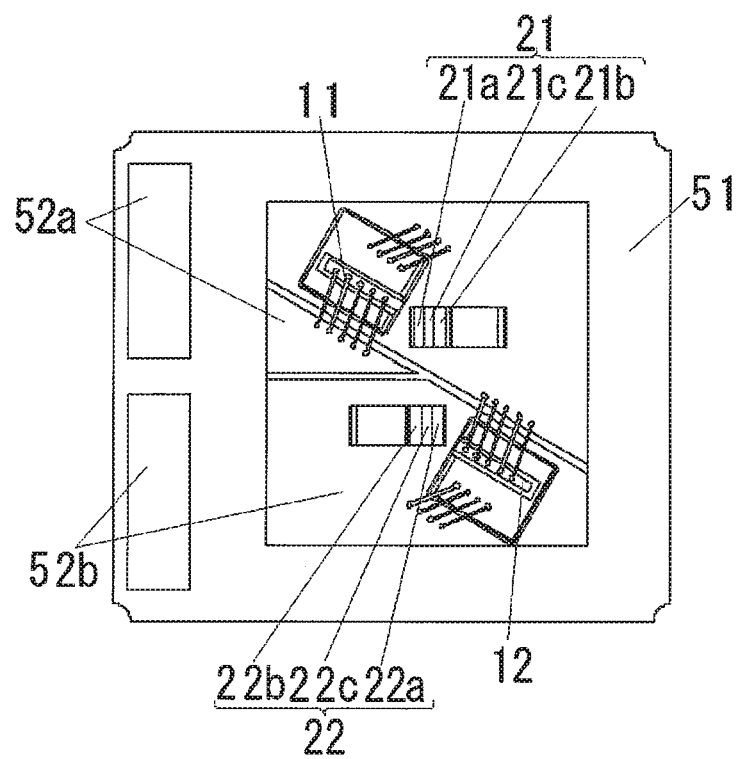
FIG. 17 is a top view illustrating the interior of the recess of the light emitting device related to the third embodiment.
Figure 18:
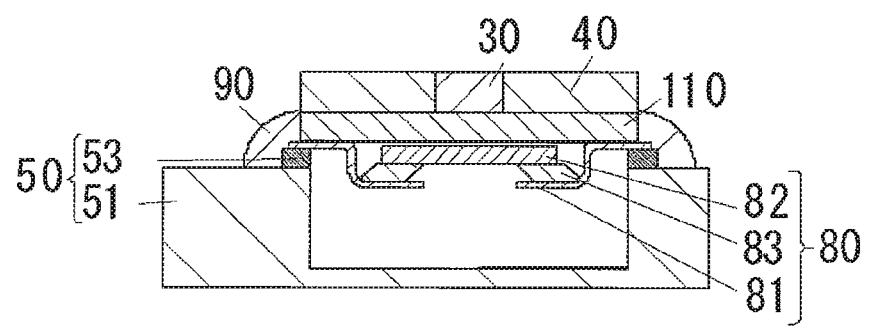
FIG. 18 is an end view taken along XVIII-XVIII in FIG. 16.

FIG. 15 is a perspective view of the light emitting device 400 related to a third embodiment. FIG. 16 is a top view of the light emitting device 400. FIG. 17 is a top view for illustrating the interior of the recess in the light emitting device 400. FIG. 18 is an end view taken along XVIII-XVIII in FIG. 16. The light emitting device 400 is essentially identical to the light emitting device 300 except for the features described below.

The light emitting device 400 employs a base that has no second upper surface for the base 50. A cover 80 that includes a metal support 81 and a light transmissive member 82 makes the space in which a first LD element 11 and other components are disposed an airtight space. The support 81 and the light transmissive member 82 are bonded using a bonding material 83. Furthermore, the part of the base 50 that comes into contact with the cover 80 is formed of a material comprising a metal. The support 81 of the cover 80 and the base 50 are secured by soldering so that the light reflected by the first light reflecting member 21 transmits through the light transmissive member 82 of the cover 80.

The support 81 and the part of the base 50 in contact with the cover 80 are structured with a material comprising iron as a main component. "Containing as a main component" here refers to containing a material in excess of 50% relative to the total weight. The light transmissive member 82 is structured with a material comprising glass. A heat dissipater 110 is further disposed on or above the support 81, but under the phosphor member 30 and the light shielding member 40. Example materials of the heat dissipater 110 include sapphire, quartz, or silicon nitride. Sapphire is preferably used for the heat dissipater 110.

In this embodiment, because the distance between the first light reflecting member 21 and the phosphor member 30 is longer by the thickness of the cover 80, angle α and angle β therein are smaller than the angle α and angle β in the light emitting device 300. For example, angle α and angle β are set to 30 degrees. The first light reflecting member 21 and the second light reflecting member 22 each have three light reflecting surfaces.

What is shown is an example of the light emitting device 400 without a thermistor, but the light emitting device 400 may include a thermistor as in the case of the light emitting device 300.

The light emitting device described in the present disclosure can be used in lighting fixtures, automotive lamps, and the like.

What is claimed is:

1. A light emitting device comprising:
a base;
a first semiconductor laser element disposed on an upper surface of the base and configured to emit first light;
a first light reflecting member disposed on the upper surface of the base and configured to reflect the first light upwards;
a phosphor member having a lower surface onto which the first light is irradiated and an upper surface serving as a light extraction surface; and
a light shielding member surrounding lateral surfaces of the phosphor member, wherein:
the first light reflecting member comprises a first region onto which a first portion of the first light is irradiated, and a second region onto which a second portion of the first light is irradiated, the second region being positioned farther from the first semiconductor laser element than the first region, and
the first region and the second region are formed such that:
the light reflected from the first region and the second region is irradiated on an irradiated region of the lower surface of the phosphor member, the irradiated region including:
a first end portion on a side of the irradiated region closer to the first semiconductor laser element in a longitudinal direction of the irradiated region, and
a second end portion on a side of the irradiated region farther from the first semiconductor laser element in the longitudinal direction of the irradiated region,
a portion of the light reflected from a portion of the first region that is on a side close to the second region and a portion of the light reflected from a portion of the second region that is on a side close to the first region intersect before reaching the lower surface of the phosphor member,
the portion of the light reflected from the portion of the first region that is on the side close to the second region irradiates the second end portion of the irradiated region, and
the portion of the light reflected from the portion of the second region that is on the side close to the first region irradiates the first end portion of the irradiated region.

2. The light emitting device according to claim 1, wherein:
the first region and the second region are planar, and
in a plane perpendicular to the upper surface of the base and the first region and the second region of the first light reflecting member, an angle formed by the upper surface of the base and the first region is smaller than an angle formed by the upper surface of the base and the second region.

3. The light emitting device according to claim 1 further comprising:
a second semiconductor laser element disposed on the upper surface of the base and emitting second light, and
a second light reflecting member disposed on the upper surface of the base and configured to reflect the second light upwards, wherein:
the second light reflecting member comprises a third region onto which a first portion of the second light is irradiated, and a fourth region onto which a second portion of the second light is irradiated, the fourth region being at a position farther from the second semiconductor laser element than the third region, and
the third region and the fourth region are formed such that:
the light reflected from the third region and the fourth region is irradiated on a second irradiated region of the lower surface of the phosphor member, the second irradiated region including:
a third end portion on a side of the second irradiated region closer to the second semiconductor laser element in a longitudinal direction of the second irradiated region, and
a fourth end portion on a side of the irradiated region farther from the second semiconductor laser element in a longitudinal direction of the second irradiated region,
a portion of the light reflected from a portion of the third region that is on a side close to the fourth region and a portion of the light reflected from a portion of the fourth region that is on a side close to the third region intersect before reaching the lower surface of the phosphor member,
the portion of the light reflected from the portion of the third region that is on the side close to the fourth region irradiates the fourth end portion of the second irradiated region, and
the portion of the light reflected from the portion of the fourth region that is on the side close to the third region irradiates the third end portion of the second irradiated region.

4. The light emitting device according to claim 1, wherein:
an angle formed by the upper surface of the base and the first region of the first light reflecting member is larger than 15 degrees, but smaller than 45 degrees.

5. The light emitting device according to claim 1, wherein:
an angle formed by the upper surface of the base and the second region of the first light reflecting member is larger than 45 degrees, but smaller than 75 degrees.

6. The light emitting device according to claim 1, wherein:
the base comprises a recess in which the first semiconductor laser element and the first light reflecting member are disposed,
the recess is defined by a first upper surface, located at a bottom surface of the recess, on which the first semiconductor laser element and the first light reflecting member are disposed, and a second upper surface positioned above the first upper surface,
a cover is disposed on the second upper surface, and
the phosphor member and the light shielding member are secured on an upper surface of the cover.

7. The light emitting device according to claim 2, wherein
the base comprises a recess in which the first semiconductor laser element and the first light reflecting member are disposed,
the recess is defined by a first upper surface, located at a bottom of the recess, on which the first semiconductor laser element and the first light reflecting member are disposed, and a second upper surface positioned above the first upper surface,
a cover is disposed on the second upper surface, and
the phosphor member and the light shielding member are secured on an upper surface of the cover.

8. The light emitting device according to claim 3, wherein:
the first semiconductor laser element and the second semiconductor laser element are disposed such that an emission surface of the first semiconductor laser element is positioned diagonally from an emission surface of the second semiconductor laser.

9. The light emitting device according to claim 3, wherein:
an angle formed by the upper surface of the base and the first region of the first light reflecting member is larger than 15 degrees, but smaller than 45 degrees, and
an angle formed by the upper surface of the base and the third region of the second light reflecting member is larger than 15 degrees, but smaller than 45 degrees.

10. The light emitting device according to claim 3, wherein:
an angle formed by the upper surface of the base and the first region of the first light reflecting member is larger than 15 degrees, but smaller than 45 degrees, and
an angle formed by the upper surface of the base and the fourth region of the second light reflecting member is larger than 45 degrees, but smaller than 75 degrees.

11. The light emitting device according to claim 3, wherein
the base comprises a recess in which the first semiconductor laser element and the first light reflecting member are disposed,
the recess is defined by a first upper surface, located at a bottom of the recess, on which the first semiconductor laser element and the first light reflecting member are disposed, and a second upper surface positioned above the first upper surface,
a cover is disposed on the second upper surface, and
the phosphor member and the light shielding member are secured on an upper surface of the cover.

12. The light emitting device according to claim 8, wherein
the base comprises a recess in which the first semiconductor laser element and the first light reflecting member are disposed,
the recess is defined by a first upper surface, located at a bottom of the recess, on which the first semiconductor laser element and the first light reflecting member are disposed, and a second upper surface positioned above the first upper surface,
a cover is disposed on the second upper surface, and
the phosphor member and the light shielding member are secured on an upper surface of the cover.

13. The light emitting device according to claim 8, wherein:
a plane perpendicular to the emission surface of the first semiconductor laser element and the upper surface of the base is not parallel to a plane perpendicular to the upper surface of the base and the first region and the second region of the first light reflecting member, and
a plane perpendicular to the emission surface of the second semiconductor laser element and the upper surface of the base is not parallel to a plane perpendicular to the upper surface of the base and the third region and the fourth region of the second light reflecting member.

14. The light emitting device according to claim 13, wherein:
where a first plane is defined to be perpendicular to the emission surface of the first semiconductor laser element and the upper surface of the base, and a second plane is defined to be perpendicular to the upper surface of the base and the first region and the second region of the first light reflecting member, an angle between the first plane and the second plane is in a range of 10 to 60 degrees, and
where a third plane is defined to be perpendicular to the emission surface of the second semiconductor laser element and the upper surface of the base, and a fourth plane is defined to be perpendicular to the upper surface of the base and the third region and the fourth region of the second light reflecting member, an angle between the third plane and the fourth plane is in a range of from 10 to 60 degrees.

15. The light emitting device according to claim 13, wherein
the base comprises a recess in which the first semiconductor laser element and the first light reflecting member are disposed,
the recess is defined by a first upper surface, located at a bottom of the recess, on which the first semiconductor laser element and the first light reflecting member are disposed, and a second upper surface positioned above the first upper surface,
a cover is disposed on the second upper surface, and
the phosphor member and the light shielding member are secured on an upper surface of the cover.

* * * * *